(12) United States Patent
Kodnani et al.

(10) Patent No.: US 6,248,614 B1
(45) Date of Patent: Jun. 19, 2001

(54) FLIP-CHIP PACKAGE WITH OPTIMIZED ENCAPSULANT ADHESION AND METHOD

(75) Inventors: Ramesh R. Kodnani, Binghamton; Luis J. Matienzo, Endicott; Son K. Tran, Endwell, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/272,518

(22) Filed: Mar. 19, 1999

(51) Int. Cl.[7] .......................... H01L 21/44; H01L 21/48; H01L 21/50; C08G 18/00
(52) U.S. Cl. ...................... 438/107; 438/108; 438/127; 520/1; 528/44
(58) Field of Search .................................. 438/107, 108, 438/127; 520/1; 528/44

(56) References Cited

U.S. PATENT DOCUMENTS

| | | |
|---|---|---|
| 3,013,926 | 12/1961 | Railsback et al. . |
| 4,211,824 | 7/1980 | Yoshida . |
| 4,251,409 | 2/1981 | Neubert . |
| 4,388,132 | 6/1983 | Hoge et al. . |
| 4,680,228 | 7/1987 | Sharma . |
| 5,121,190 | 6/1992 | Hsiao et al. . |
| 5,147,084 | 9/1992 | Behun et al. . |
| 6,074,895 * | 6/2000 | Dery et al. ........................... 438/108 |
| 6,107,009 * | 8/2000 | Tan ....................................... 430/331 |
| 6,121,689 * | 9/2000 | Capote et al. ....................... 257/783 |

OTHER PUBLICATIONS

"Process Considerations in the Fabrication of Teflon Printed Circuit Boards", by Light et al, 1994 Proceedings, 44 Electronic Components & Technology Conference, May 1994.

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

* cited by examiner

*Primary Examiner*—Richard Elms
*Assistant Examiner*—Adam Pyonin
(74) *Attorney, Agent, or Firm*—DeLio & Peterson, LLC; Peter W. Peterson

(57) ABSTRACT

An electronic module having enhanced adhesion at the chip passivation and underfill interface is disclosed. The surface of the chip passivation is chemically modified to a sufficient depth such that the cured passivation is more reactive. The modified surface is treated with a polyamine preferably having a cyclic amine group extending from a preferably aliphatic backbone. During reflow of the solder joints of the electronic module by heating, the modified passivation reacts with the polyamine at the amine functionality. Following underfill of the electronic module with a polymeric material, preferably an epoxy resin, the polyamine on the surface of the passivation reacts with the underfill material during curing of the underfill material. The resulting electronic module is more robust since the amine acts as a chemical anchoring site for both the modified passivation and the underfill material. A method of assembling an electronic module utilizing the polyamine treatment at the chip and wafer level is also disclosed.

21 Claims, 4 Drawing Sheets

FLIP-CHIP PACKAGE WITH OPTIMIZED ENCAPSULANT ADHESION AND METHOD

BACKGROUND OF THE INVENTION

1. Field of the Invention

This invention relates to the manufacture of electronic modules, namely flip chip packaging, utilizing an improved method of assembling the module. The improved method provides enhanced adhesion between a chip and a substrate by treating the passivation coating of the chip. The result is a more robust electronic module.

2. Description of Related Art

Typically, in flip chip packaging, one or more integrated circuit chips are mounted on a substrate to comprise the electronic module. Pads on the chip are electrically and mechanically connected to corresponding pads on the substrate by a plurality of electrical connections such as solder joints. The chip and substrate are then subjected to a higher temperature causing the solder to melt and wet each pad in the module. The assembly is cooled causing the solder to solidify, thereby providing one or more electrical connections between the chip and the substrate to form the electronic module.

Subsequently, the module may receive a nonconductive underfill to reduce the fatigue of the solder joints, provide better adhesion between the chip and the substrate, and protect the module from contaminants. In underfilling the electronic module, a polymer, typically an epoxy resin, with ceramic or glass filler, is allowed to flow under the chip, between the solder joints, and heated at an elevated temperature to cure the underfill material.

However, it is difficult to promote adhesion between the chip and the underfill material. A layer of passivation on the chip once cured is substantially inert. Thus, it would be desirable to treat the cured passivation of the chip such that it is reactive and will bond to the underfill material.

Bearing in mind the problems and deficiencies of the prior art, it is therefore an object of the present invention to provide a robust electronic module having enhanced adhesion between the chip and substrate.

It is another object of the present invention to provide a method of assembling a robust electronic module having enhanced adhesion between the chip and substrate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for providing enhanced adhesion comprising the steps of:

(a) providing a polymeric film;
(b) modifying the polymeric film by oxidizing a surface of the polymeric film to form a modified polymeric film;
(c) treating the modified polymeric film with a polyamine;
(d) providing a polymeric material for adhesion to the polymeric film; and
(e) contacting the polymeric material to the polymeric film.

In another aspect, the present invention is directed to a method of forming an electronic module comprising the steps of:

(a) providing an integrated circuit chip having a passivation layer thereon;
(b) modifying the passivation layer by oxidizing a surface of the passivation layer forming a modified passivation layer;
(c) treating the modified passivation layer with a polyamine;
(d) providing a substrate;
(e) contacting the chip to the substrate;
(f) underfilling a gap between the chip and the substrate with an encapsulant; and
(g) curing the encapsulant.

Preferably, step (b) may comprise modifying the passivation layer with an $O_2$ plasma at about 200 to about 400 Watts for about 0.2 to about 5 minutes at about 0.1 to about 1 Torr with an $O_2$ flow rate of about 25 to about 200 cc/minute to form a modified passivation layer. Alternatively, step (b) may comprise modifying the passivation layer with ultraviolet light and $O_3$ for about 1 to about 30 minutes at wavelengths of 184.9 nm and 253.7 nm to form a modified passivation layer. Preferably, step (c) comprises treating the modified passivation layer with a solution of about 0.1 to about 50 wt. % of a polyamine having a molecular weight of up to about 500,000.

Preferably, the polyamine comprises a cyclic amine having one of the following structures:

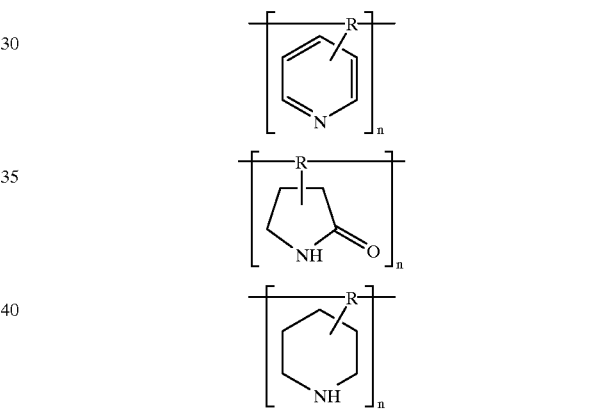

wherein R may comprise a suitable alkyl group having the formula $C_XH_{2X-1}$, where X is from 1 to 10 and n is about 90 to about 5000.

In yet another aspect, the present invention is directed to a method of forming an electronic module comprising the steps of:

(a) providing an integrated circuit chip having a polyimide layer thereon, a surface of the polyimide layer modified to form a modified polyimide layer;
(b) treating the modified polyimide layer with a 1 to 5% solution of poly(4-vinylpyridine);
(c) providing a substrate having interconnect pads corresponding to solder joints on the chip;
(d) contacting the chip to the substrate;
(e) forming an electronic module by reflowing the solder joints to electrically and mechanically connect the chip to the substrate;
(f) underfilling the electronic module with an encapsulant; and
(g) curing the encapsulant for a sufficient time and temperature.

Preferably, step (b) comprises treating the modified polyimide layer with an about 5% solution of poly(4-vinylpyridine) at about 0° C. for about 5 minutes such that the poly(4-vinylpyridine) substantially coats the modified polyimide layer. Preferably, during reflowing of the solder joints in step (e), the poly(4-vinylpyridine) substantially reacts with the modified polyimide layer.

In still yet another aspect, the present invention is directed to a method of treating a wafer to provide chips having enhanced adhesion in an electronic module comprising the steps of:

(a) providing a wafer having a plurality of electrical devices formed and a passivation layer thereon;

(b) patterning and etching the passivation layer to form bonding pads corresponding to the electrical devices;

(c) applying solder to the bonding pads;

(d) oxidizing a surface of the passivation layer to form a modified passivation layer;

(e) treating the modified passivation layer with a solution of about 0.1 to about 50 wt. % of a polyamine;

(f) reflowing the solder; and (g) dicing the wafer to form individual chips.

Preferably, the polyamine comprises a cyclic amine having one of the following structures:

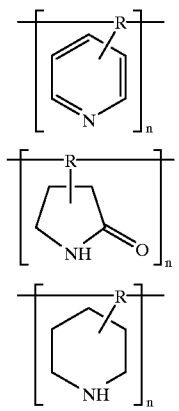

wherein R may comprise a suitable alkyl group having the formula $C_XH_{2X-1}$, where X is from 1 to 10 and n is about 90 to about 5000. Most preferably, the polyamine comprises poly(4-vinylpyridine) having a molecular weight of about 20,000.

In a final aspect, the present invention is directed to an electronic module comprising a substrate; an integrated circuit chip aligned to the substrate through a plurality of solder joints, the chip having a layer of passivation thereon, the layer of passivation having an oxidized surface and treated with a polyamine; and an underfill material disposed between the chip and the substrate, wherein upon heating the module to reflow the solder joints, the oxidized surface of said passivation is adapted to react with said polyamine, and during curing of said underfill material, said underfill material is adapted to react with said polyamine.

Preferably, the polyamine comprises poly(4-vinylpyridine).

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
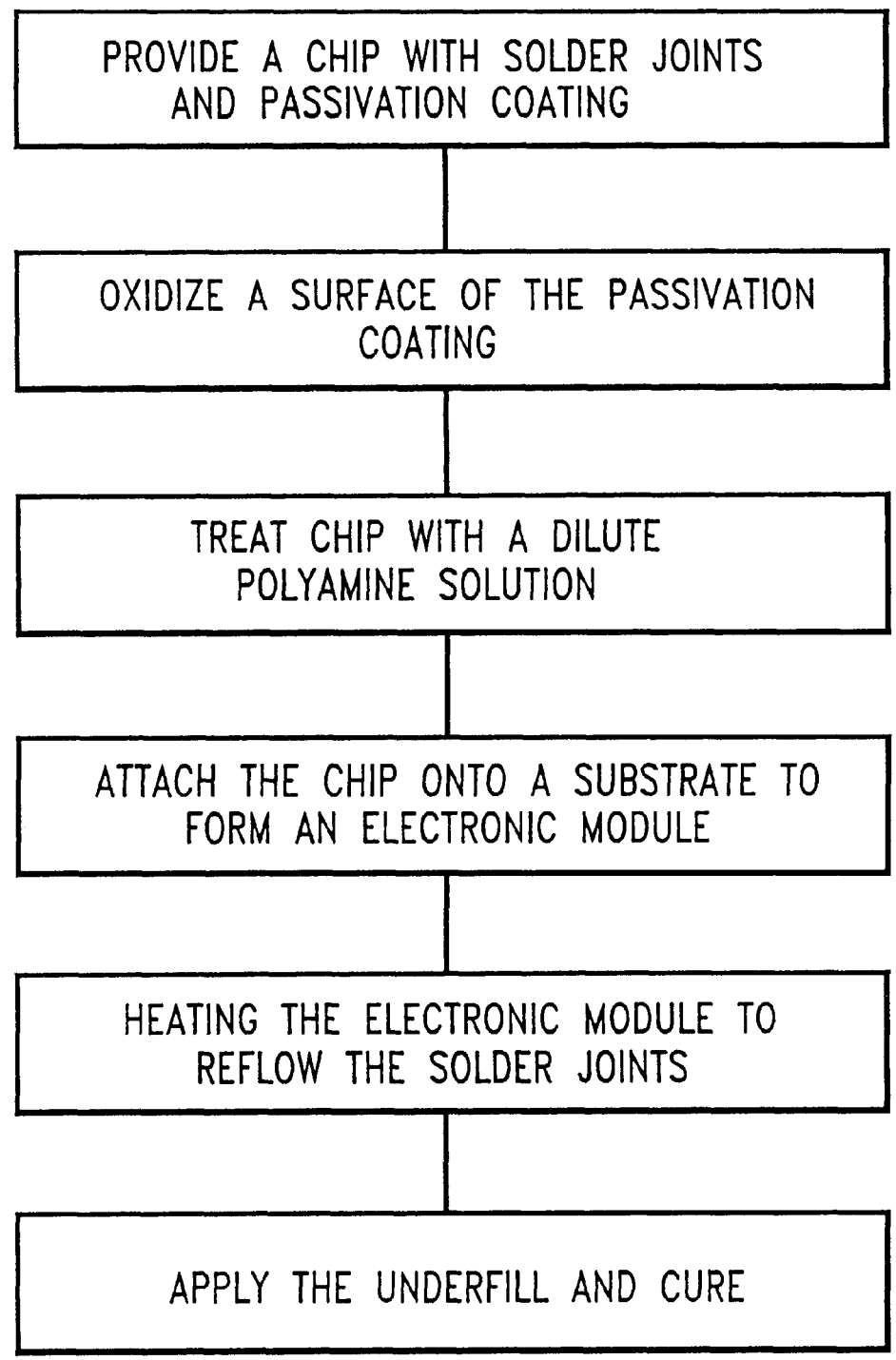
FIG. 1 is a flow diagram of a preferred embodiment of a method of the present invention at the chip level.

In describing the preferred embodiment of the present invention, reference will be made herein to FIGS. 1–4 of the drawings in which like numerals refer to like features of the invention. Features of the invention are not necessarily shown to scale in the drawings.

The present invention is directed to a laminate flip-chip package structure that is robust with high fracture and delamination resistance at the chip passivation and underfill interface. This is accomplished by modifying the chip surface, preferably, in accordance with the steps outlined in the flowchart of FIG. 1 for forming a robust electronic module or flip chip package.

A typical integrated circuit chip having a plurality of electrical devices thereon may be mounted on a single or multi-layer substrate. Generally, pads on the chip are electrically and mechanically connected to corresponding pads on the substrate by a plurality of electrical connections such as solder joints. The solder joints may be formed on the chip by any means known in the art, for example, by plating or evaporation.

Generally, prior to forming the solder joints, the chip is preferably coated with a suitable passivation layer and cured. Examples of suitable passivation materials may include polyimide, benzocyclobutene, and polyimide-polysiloxane co-polymers. A preferred passivation material comprises polyimide. The passivation is typically patterned and etched according to known methods in the art at the sites requiring solder joints. Since the passivation is preferably a cured polymeric material, it is fairly unreactive and must be treated in order to react with another polymer. Thus, to enhance the adhesion of the passivation to the underfill, the surface of the passivation must be modified to provide the necessary reactive sites.

The present invention utilizes chemical modification of a surface of the passivation material to form a modified passivation followed by treating the modified passivation with a non-silane coupler, in particular, a polyamine coupling agent. Preferably, exposure to an oxidizing atmosphere is used to chemically modify the passivation to a sufficient depth making it more reactive than the cured passivation material. Of course, other chemical modification techniques may be used such as ion beam bombardment of the passivation layer. It is suspected that the chemical modification of the passivation material allows formation of free carboxyl groups on the surface of the passivation material by sufficiently oxidizing a top surface of the passivation.

Preferably, the oxidizing atmosphere may comprise an $O_2$ plasma at about 200 to about 400 Watts for about 0.2 to about 5 minutes under the following conditions: about 0.1 to about 1 Torr with an $O_2$ flow rate of about 25 to about 200 cc/minute. Most preferably, the $O_2$ plasma conditions occur at about 300 Watts, at about 0.35 Torr with a flow rate of about 75 cc/minute for about 1 to about 3 minutes in a plasma reaction chamber.

Another embodiment utilizes an ultraviolet (UV) light source which is able to produce $O_3$ from the air surrounding the chip in a $UV/O_3$ reaction chamber. The chip is typically placed at a distance of about 2 to about 50 mm away from the UV light source and exposed to the UV and $O_3$ generated for about 1 to about 30 minutes. The wavelengths generated by the UV light source are 184.9 nm and 253.7 nm. Preferably, the chip is placed about 5 to 6 mm away from the light source for about 5 to about 10 minutes.

Once the chip passivation has been modified, a dilute solution of a non-silane coupler, in particular, a polyamine coupling agent in a suitable solvent is applied to the chip surface, e.g., by dipping the chip. Preferably, the polyamine coupling agent has a molecular weight in the range of up to about 500,000, most preferably about 20,000. The polyamine may include saturated and unsaturated aliphatic and cyclic amines, and quaternary salts of the amine. Preferably, the polyamine has an aliphatic backbone for flexibility in solution with the amine functionalities branching off the aliphatic backbone. The polyamine is preferably used in about 0.1 to about 50 wt. % solution using any suitable solvent which dissolves the amine, and most preferably at a concentration of about 1 to 5%.

Preferably, the polyamine comprises a cyclic amine having one of the following structures:

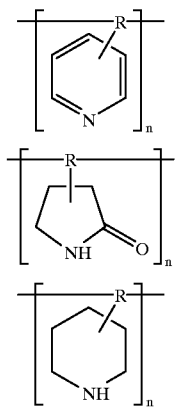

wherein R may comprise a suitable alkyl group having the formula $C_XH_{2X-1}$, where X is from 1 to 10, most preferably where X is 1 (methyl) or 2 (ethyl), and n is about 90 to about 5000. Most preferably the cyclic amines comprise poly(3-vinylpyridine), poly(4-vinylpyridine), 2-methyl-5-vinylpyridine, 5-ethyl-2-vinylpyridine, poly(3-vinylpyrrolidone), poly(4-vinylpyrrolidone), poly(3-vinylpiperidine), and poly(4-vinylpiperidine). The most preferred polyamine comprises poly(4-vinylpyridine) due to its demonstrated effectiveness. The poly(4-vinylpyridine) is used as a methanolic solution at a concentration of about 1 to about 5%, even more preferably at about 5%. Suitable quaternary salts of the polyamines such as poly(N-methyl-4-pyridium bromide), may also be used in the present invention to provide better solubility of the polyamine when preparing the solution.

Monitoring of a chip surface having a polyimide passivation coating was performed by X-ray Photoelectron Spectroscopy (XPS) using a Physical Electronics 5500 Multi-probe Spectrometer. The following table shows the atomic percentages of carbon, nitrogen and oxygen of the polyimide surface prior to treatment, after chemical modification of the surface and also after treatment with the polyamine. The sample chip had a PMDA-ODA polyimide coating. The surface modification technique employed an $O_2$ plasma at about 0.35 Torr for about 3 minutes with an $O_2$ flow rate of about 75 cc/minute followed by treatment with a 5% solution of poly(4-vinylpyridine) in methanol.

TABLE I

| Sample | %C | %N | %O |
|---|---|---|---|
| polyimide | 79.1 | 6.3 | 14.6 |
| w/surface modification | 61.4 | 7.5 | 31.2 |
| w/surface modification & amine treatment | 82.6 | 10.3 | 6.7 |

Exposing the polyimide to the $O_2$ plasma increases the oxygen concentration of the surface of the polyimide due to oxidation of the polyimide structure. Oxidation of the polyimide ring forms free carboxyl groups on the surface to provide the reactive sites needed to attach the polyamine. After treatment with the polyamine, the nitrogen and carbon concentrations increase as expected since the polyamine is adsorbed onto the surface of the modified polyimide.

The most preferred embodiment of the present method utilizes a dilute solution of poly(4-vinylpyridine) of about 1 to about 5% in methanol. The chip is dipped into the solution at about 0° C. for about 1 to about 30 minutes, preferably about 5 minutes, to allow the amine sufficient time to adsorb onto the modified passivation and form a quaternary salt. The chip is then rinsed with the methanol to remove any excess unadsorbed amine. Typically, more than one application of the amine solution is preferred to ensure formation of the quaternary salt on the surface of the modified passivation.

Following treatment of the chip with the polyamine coupling agent, the solder joints on the chip are aligned to correspond to the interconnect pads on the substrate. The solder joints may be fluxed to increase the wettability of the solder. The solder joints are reflowed by heating for a time and temperature sufficient to melt the solder. While not wishing to be bound by theory, it is believed that during reflow, the polyamine reacts with the modified passivation on the surface of the passivation. However, there are still unbound amine sites along the polyamine chain for further reaction with the underfill material to provide the adhesive strength of the present invention.

After reflow of the solder joints, the flip chip package is underfilled with a suitable encapsulant. Typical encapsulants comprise polymers, preferably epoxy resins, known in the art. Suitable encapsulants are available from the Dexter Corporation of Industry, California, and marketed as FP4511 and FP4527. The encapsulant is dispensed according to conventional methods along the edges of the chip and fills the gap between the chip and substrate by capillary action. Upon curing the underfill encapsulant under the appropriate conditions specified by the manufacturer of the encapsulant, the encapsulant chemically reacts with the polyamine coupling agent. It is believed that the polyamine, while anchored to the passivation at one end by having reacted with the modified passivation, reacts with the encapsulant at the epoxy ring sites with the remaining free amine functionalities on the polyamine.

Figure 3:
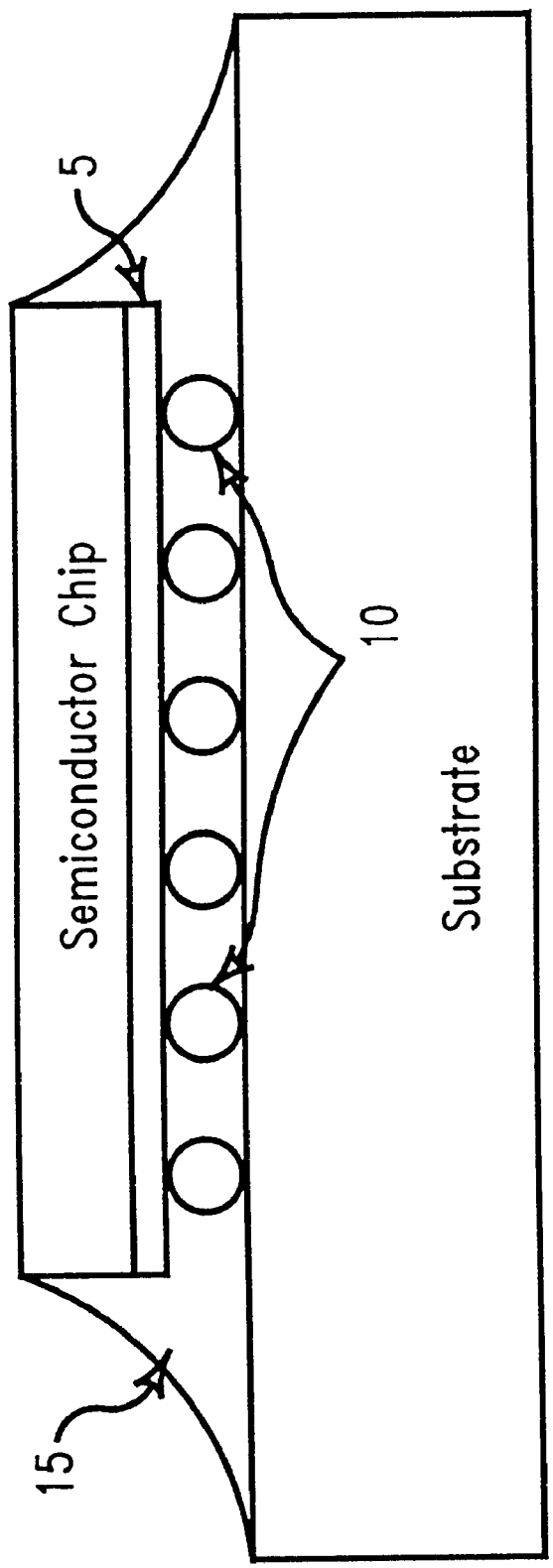
FIG. 3 is a cross-sectional view of an electronic module assembled in accordance with a method of the present invention.

The resulting electronic module is shown in FIG. 3 where the semiconductor chip having modified passivation 5 is connected to the substrate with solder joints 10. An underfill material 15 is dispensed between the chip and the substrate. The polyamine reacts with the modified passivation and the underfill material to provide enhanced adhesion at the chip and underfill interface.

Figure 2:
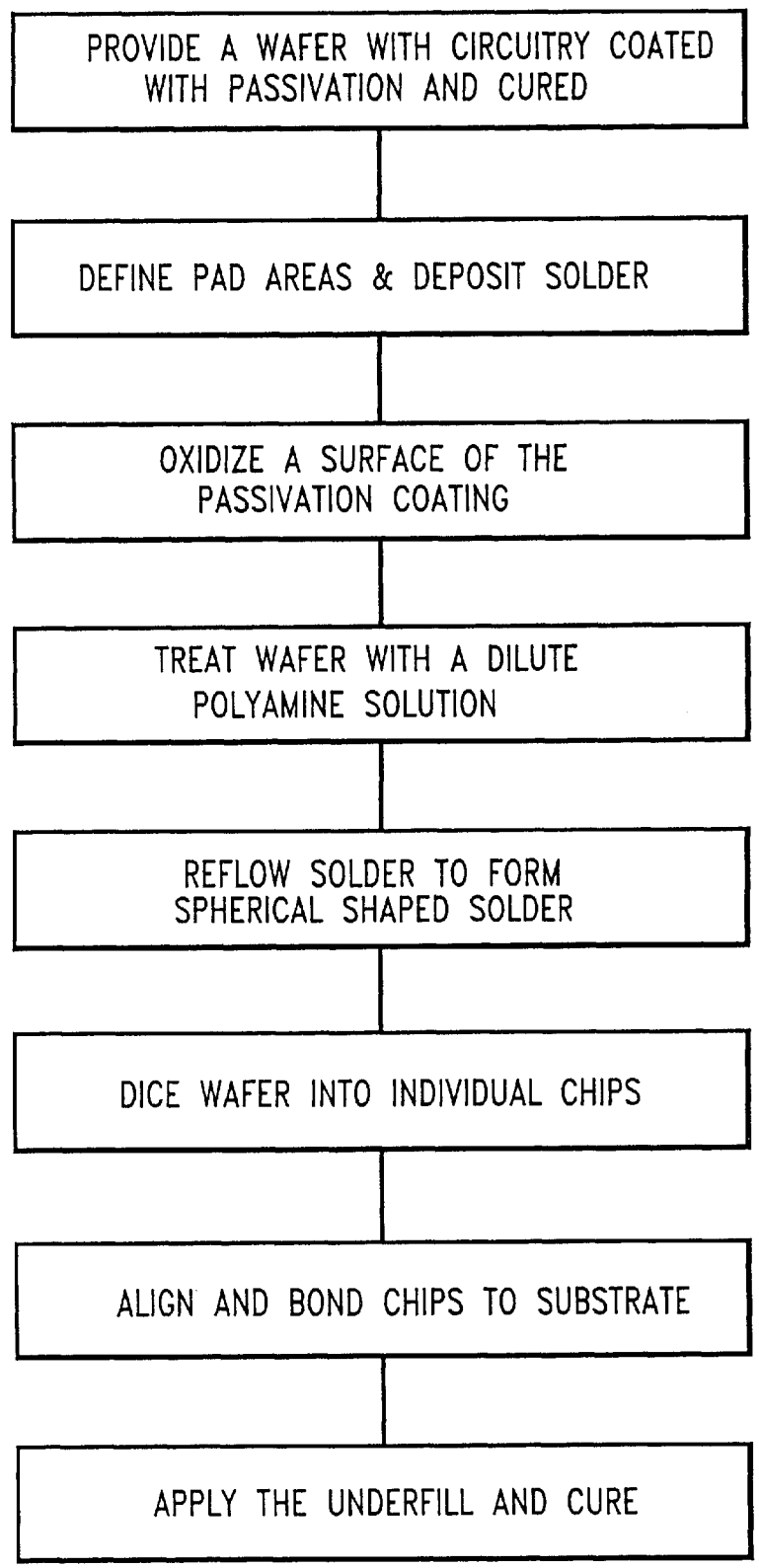
FIG. 2 is a flow diagram of a preferred embodiment of a method of the present invention at the wafer level.

An unexpected advantage in utilizing the present method is that the chips may be treated with the polyamine at the wafer level. Treating the wafer increases the manufacturability and decreases the cost of flip chip packaging. The flow diagram of FIG. 2 shows the steps involved in implementing the present method at the wafer level.

A silicon wafer having one or more devices or circuits formed thereon is coated with passivation and cured. The pad areas for each resulting chip are defined by patterning and etching according to conventional methods. The solder joints for each resulting chip are formed by conventional methods, for example, plating or evaporation.

The wafer is subjected to the chemical modification as described above and a surface of the passivation material is oxidized. A polyamine solution is applied to the modified passivation. The solder deposition on the wafer is reflowed to form uniform spherical shapes. The wafer is diced to singulate the individual chips. The individual chips are electrically and mechanically connected to a substrate and the underfill applied and cured. The same process conditions employed on the chip level discussed above are also used at the wafer level processing.

Another unexpected advantage is where the substrate is an organic substrate. Organic substrates which may have a passivation coating or other polymeric coating thereon may be subjected to the oxidation and treatment with the polyamine to provide enhanced adhesion at the underfill and substrate interface.

The present method of using a non-silane coupler, particularly the demonstrated effectiveness of polyamines, unexpectedly provides a substantial increase in the strength of the flip chip package at the chip and underfill interface. Chip-pull tests of flip chip test samples without solder joints assembled in accordance with the present invention show about 120% improvement in adhesion strength over untreated flip chip test samples. Surprisingly, the test samples after treatment are so robust that in fracture experiments, the interface between the underfill and chip remains intact while the layers of a laminate substrate tear.

Figure 4:
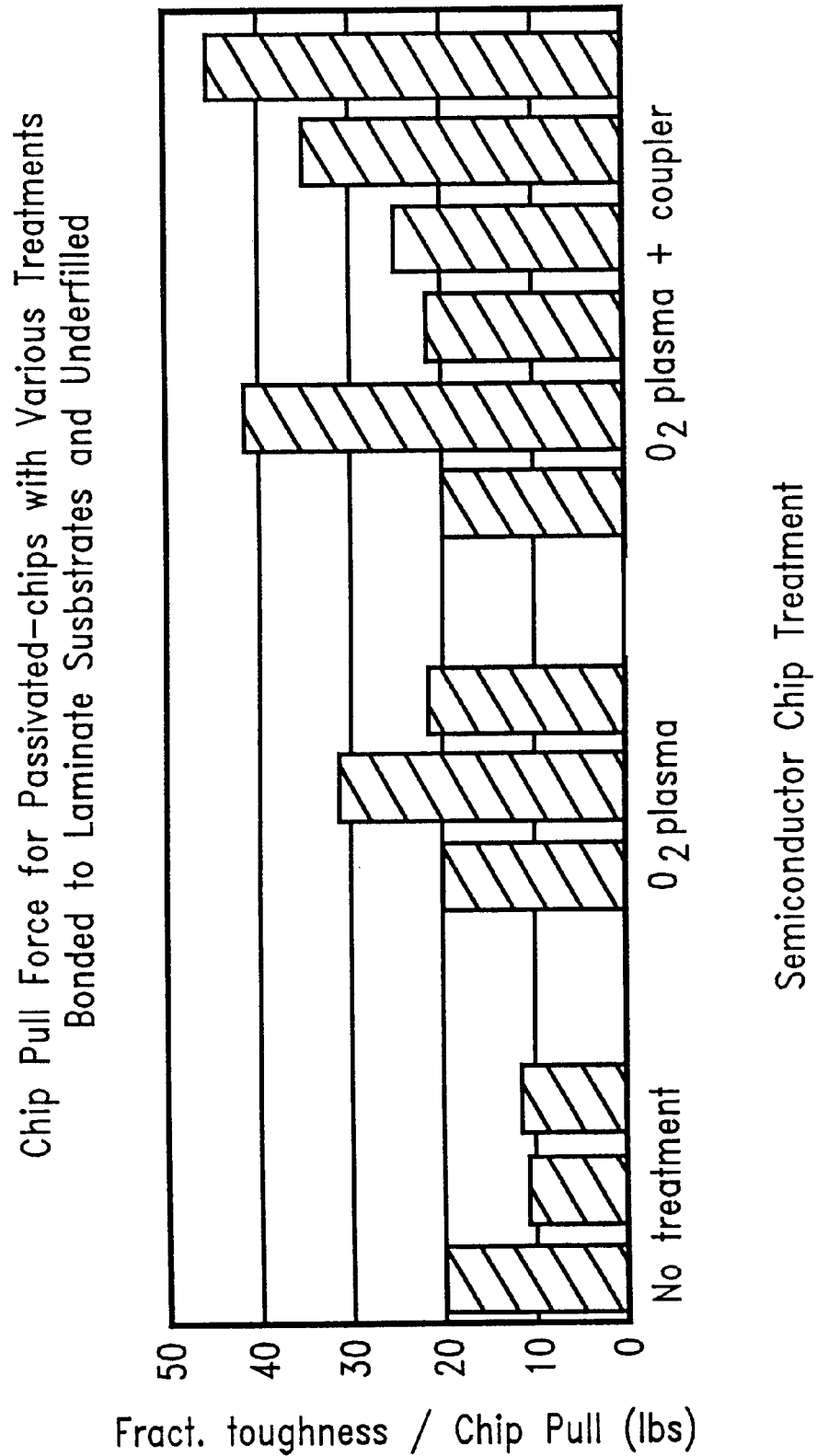
FIG. 4 is a comparison of the amount of force needed in chip-pull tests to delaminate flip chip test samples treated in accordance with a method of the present invention with untreated samples.

FIG. 4 shows a comparison of the chip-pull force of a flip chip test sample assembled in accordance with the present invention and untreated flip chip test samples. On average, where there was no treatment of the test sample, about 14 lbs. was required to pull apart the test sample. Where the test sample was merely treated with an $O_2$ plasma, the average force required to pull the flip chip apart was about 25 lbs. However, in practicing the present invention where the test sample was exposed to an $O_2$ plasma at about 0.35 Torr for about 3 minutes with an $O_2$ flow rate of about 75 cc/minute followed by treatment with a 5% solution of poly(4-vinylpyridine) in methanol, the force required was on the average of about 32 lbs.

The present invention achieves the objects cited above. It has been unexpectedly found that altering the surface of the passivation coating on the chip of an electronic module with a chemical modifier followed by treatment with a polyamine coupling agent provides enhanced adhesion at the chip and underfill interface. The resulting electronic module is more robust since the amine acts as a chemical anchoring site for both the modified passivation and the underfill material.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming an electronic module comprising the steps of:

(a) providing an integrated circuit chip having a passivation layer thereon;

(b) modifying the passivation layer by oxidizing a surface of said passivation layer forming a modified passivation layer;

(c) treating the modified passivation layer with a polyamine;

(d) providing a substrate;

(e) contacting said chip to said substrate;

(f) underfilling a gap between said chip and said substrate with an encapsulant; and (g) curing said encapsulant.

2. The method of claim 1 wherein step (a) comprises providing an integrated circuit chip having a polyimide layer thereon.

3. The method of claim 1 wherein step (b) comprises modifying the passivation layer with an $O_2$ plasma at about 200 to about 400 Watts for about 0.2 to about 5 minutes at about 0.1 to about 1 Torr with an $O_2$ flow rate of about 25 to about 200 cc/minute to form a modified passivation layer.

4. The method of claim 1 wherein step (b) comprises modifying the passivation layer with ultraviolet light and $O_3$ for about 1 to about 30 minutes at wavelengths of 184.9 nm and 253.7 nm to form a modified passivation layer.

5. The method of claim 1 wherein step (c) comprises treating the modified passivation layer with a solution of about 0.1 to about 50 wt. % of a polyamine having a molecular weight of up to about 500,000.

6. The method of claim 1 wherein step (c) comprises treating said modified passivation layer with a polyamine having the following structure:

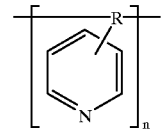

wherein R has the formula $C_XH_{2X-1}$ and X is equal to 1 to 10 and n is about 90 to about 5000.

7. The method of claim 1 wherein step (c) comprises treating said modified passivation layer with a solution of about 0.1 to 50 wt. % poly(4-vinylpyridine) having a molecular weight of about 20,000.

8. The method of claim 1 wherein step (c) comprises treating said modified passivation layer with a polyamine having the following structure

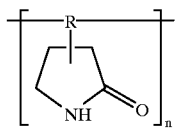

wherein R has the formula $C_xH_{2X-1}$ and X is equal to 1 to 10 and n is about 90 to 5000.

9. The method of claim 1 wherein step (c) comprises treating said modified passivation layer with a polyamine having the following structure

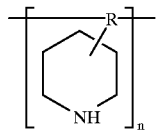

wherein R has the formula $C_xH_{2X-1}$ and X is equal to 1 to 10 and n is about 90 to about 5000.

10. A method of forming an electronic module comprising the steps of:
   (a) providing an integrated circuit chip having a polyimide layer thereon, a surface of the polyimide layer modified to form a modified polyimide layer;
   (b) treating the modified polyimide layer with a 1 to 5% solution of poly(4-vinylpyridine);
   (c) providing a substrate having interconnect pads corresponding to solder joints on said chip;
   (d) contacting said chip to said substrate;
   (e) forming an electronic module by reflowing said solder joints to electrically and mechanically connect said chip to said substrate;
   (f) underfilling said electronic module with an encapsulant; and
   (g) curing said encapsulant for a sufficient time and temperature.

11. The method of claim 10 wherein in step (a) a surface of the polyimide layer is modified by exposing the polyimide layer to an $O_2$ plasma at about 300 Watts for about 3 minutes at about 0.35 Torr at an $O_2$ flow rate of about 75 cc/minute.

12. The method of claim 10 wherein in step (a) a surface of the polyimide layer is modified by exposing the polyimide layer to ultraviolet light and $O_3$ for about 5 minutes.

13. The method of claim 10 wherein step (b) comprises treating the modified polyimide layer with an about 5% solution of poly(4-vinylpyridine) having a molecular weight of up to about 500,000 at about 0° C. for about 5 minutes such that the poly(4-vinylpyridine) substantially coats the modified polyimide layer.

14. The method of claim 10 wherein in step (e) during reflowing of said solder joints, the poly(4-vinylpyridine) substantially reacts with the modified polyimide layer.

15. A method of treating a wafer to provide chips having enhanced adhesion in an electronic module comprising the steps of:
   (a) providing a wafer having a plurality of electrical devices formed and a passivation layer thereon;
   (b) patterning and etching said passivation layer to form bonding pads corresponding to the electrical devices;
   (c) applying solder to said bonding pads;
   (d) oxidizing a surface of the passivation layer to form a modified passivation layer;
   (e) treating the modified passivation layer with a solution of about 0.1 to about 50 wt. % of a polyamine;
   (f) reflowing said solder; and
   (g) dicing said wafer to form individual chips.

16. The method of claim 15 further including the steps of:
   (h) providing a substrate and aligning the individual chips on said substrate;
   (i) forming an electronic module by reflowing said solder to electrically and mechanically connect said individual chip to said substrate;
   (j) underfilling said electronic module with an encapsulant; and
   (k) curing said encapsulant for a sufficient time and temperature.

17. The method of claim 15 wherein step (d) comprises oxidizing a surface of the passivation layer to form a modified passivation layer by exposing the passivation layer to an $O_2$ plasma.

18. The method of claim 15 wherein step (d) comprises oxidizing a surface of the passivation layer to form a modified passivation by exposing the passivation layer to ultraviolet light and $O_3$.

19. The method of claim 15 wherein in step (e) said polyamine has the following structure:

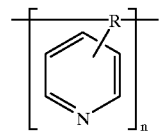

wherein R has the formula $C_xH_{2X-1}$ and X is equal to 1 to 10 and n is about 90 to about 5000.

20. The method of claim 15 wherein in step (e) said polyamine has the following structure:

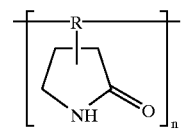

wherein R has the formula $C_xH_{2X-1}$ and X is equal to 1 to 10 and n is about 90 to 5000.

21. The method of claim 15 wherein in step (e) said polyamine has the following structure:

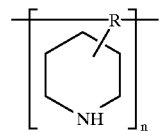

wherein R has the formula $C_xH_{2X-1}$ and X is equal to 1 to 10 and n is about 90 to about 5000.

* * * * *